United States Patent
Kunz et al.

(10) Patent No.: US 7,103,620 B2
(45) Date of Patent: Sep. 5, 2006

(54) METHOD AND APPARATUS FOR VERIFICATION OF DIGITAL ARITHMETIC CIRCUITS BY MEANS OF AN EQUIVALENCE COMPARISON

(75) Inventors: Wolfgang Kunz, Frankfurt (DE); Thomas Rudolf, Germering (DE); Dominik Stoffel, Karisruhe (DE)

(73) Assignee: OneSpin Solutions GmbH, Munich (DE)

( * ) Notice: Subject to any disclaimer, the term of this patent is extended or adjusted under 35 U.S.C. 154(b) by 689 days.

(21) Appl. No.: 10/277,700

(22) Filed: Oct. 22, 2002

(65) Prior Publication Data

US 2003/0105785 A1    Jun. 5, 2003

(30) Foreign Application Priority Data

Oct. 23, 2001    (DE) ................... 101 52 213

(51) Int. Cl.
G06F 7/00    (2006.01)
(52) U.S. Cl. .......................... 708/200; 716/3
(58) Field of Classification Search ................. 708/200
See application file for complete search history.

(56) References Cited

U.S. PATENT DOCUMENTS 6,728,939 B1 *   4/2004   Johannsen ............... 716/5
6,851,102 B1 *   2/2005   Tsuchiya ................. 716/18
2003/0121009 A1 * 6/2003   Bae ............................. 716/3

OTHER PUBLICATIONS

R. Bryant, "Graph-Based Algorithms for Boolean Function Manipulation," IEEE, 1986, pp. 677-691.
D. Brand, "Verification of Large Synthesized Designs," IEEE, 1993, pp. 534-537.
A. Kuehlmann, "Equivalence Checking Using Cuts and Heaps," DAC, 1997, pp. 263-268.

* cited by examiner

Primary Examiner—Tan V. Mai
(74) Attorney, Agent, or Firm—24IP Law Group USA; Timothy R. DeWitt

(57) ABSTRACT

A method and an apparatus for verification of arithmetic digital circuits is disclosed, wherein a first circuit, called a specification, is compared for equivalence with a further circuit called an implementation, with equivalence occurring when and only when the specification and implementation always produce the same output signals for the same input signals. The gate level description of the specification and implementation are converted to a network of elementary arithmetic 1-bit operations (XOR, half-adders, full adders) and the equivalence of the specification and implementation is identified in that a comparison of the resultant networks from elementary arithmetic 1-bit operations is carried out directly.

4 Claims, 3 Drawing Sheets

METHOD AND APPARATUS FOR VERIFICATION OF DIGITAL ARITHMETIC CIRCUITS BY MEANS OF AN EQUIVALENCE COMPARISON

CROSS-REFERENCE TO RELATED APPLICATIONS

This application claims priority to German application No. DE 101 52 213.4, filed Oct. 23, 2001, which applications is incorporated herein by specific reference.

BACKGROUND OF THE INVENTION

1. The Field of the Invention

The invention relates to a method for verification of digital arithmetic circuits by means of an equivalence comparison between a specification circuit and an implementation circuit. Furthermore, the invention relates to an apparatus for carrying out this method.

2. The Relevant Technology

Procedures are known in which a so-called equivalence comparison is carried out (equivalence checking). On the one hand, this may be done by simulating all the possible combinations of input signals with the corresponding circuits. This exhaustive simulation has the disadvantage that, as the complexity of the circuits increases, the number of necessary computation operations rises correspondingly steeply. Although the use of graphical representations of Boolean functions according to R. Bryant, "Graph-based algorithms for Boolean function manipulation" (IEEE Transactions on Computers, C-35(8), 1986, and their further developments, allow considerably larger circuits to be handled than in the exhaustive simulation, even this procedure reaches its limits with most circuits of industrial size.

Attempts have thus likewise been made to investigate the circuits first of all on the basis of their structure. In this case, in two circuits which are to be compared, internal points which are equivalent are sought. This means that the logical signals which are present at these points in response to identical input signals are the same. In this way, it is possible to compare subregions of the circuits with one another. If it can be verified that these subregions are equivalent, this knowledge can be used directly in the subsequent investigation of further areas, thus allowing step-by-step equivalence comparison of the entire circuit. The input and output points of these internal subregions are in this case referred to as internal equivalence points (internal equivalences) or cut points. As an example of such methods, which are also referred to as "structural equivalence comparison", reference should be made to D. Brand, "Verification of Large Synthesized Designs" in Proc. Intl. Conf. on Computer-Aided Design (ICCAD-93), pp. 543–547, 1993 and to W. Kunz, "An Efficient Tool for Logic Verification Based on Recursive Learning", in Proc. Intl. Conference on Computer-Aided Design (ICCAD-93), 538–543, November 1993 and, in addition, to A. Kühlmann and F. Krohm, "Equivalence Checking Using Cuts and Heaps", in Proc. Design Automation Conference (DAC-97), pp. 263–268, November 1997.

Methods for carrying out equivalence comparisons are used during circuit design. In this case, based on a first design (specification) which represents a desired circuit behaviour, this design is made specific by means of computer-assisted aids and by manual intervention by the designer in the corresponding circuit. In order to avoid faults from being introduced during this process, checks should be carried out during the synthesis of the circuit to determine whether the implementation at that time has the same behaviour as the specification at the higher level. It is therefore necessary during the equivalence comparison to determine the internal equivalence points or cut points between the design at the higher level and the circuit at that time.

This procedure has been found to be problematic in the case of circuit parts which relate to multiplication. The implementation is produced (after application of the relevant synthesis tools and possible manual actions) at gate level. In order now to allow the specification, which is at the register transfer level, to be compared with the implementation, it must be converted by the equivalence checker to a description at the gate level. In this case, it has been found to be problematic that the circuit derived from the design at the register transfer level has very major differences at the gate level in comparison with the design at gate level derived by means of the synthesis tools. This is essentially because different multiplication architectures are usual and there are a large number of implementation options for each individual architecture, so that in practice there are no equivalence points between the two circuits to be compared.

Methods which are based on decision diagrams at word level are known for equivalence comparison of arithmetic circuits. In this context, reference should be made, for example, to Bryant (TCAD85), Chen (ASP-DAC01). Since, however, the implementation is generally produced as a gate level description and there is too little information from the word level, the generation of these decision diagrams at word level is in practice often extremely complex in terms of computation and memory space.

Multipliers may be represented as a combination of two function blocks. In the first function block, the partial products of the multiplicand and the (binary) digits of the multiplier are formed. The partial products are designed to be dependent on whether the numbers to be multiplied may or may not have a negative mathematical sign, and also to be dependent on whether Booth recoding is used.

BRIEF SUMMARY OF THE INVENTION

It is an object of the present invention is to provide a method and an apparatus which allow an equivalence investigation of multipliers.

In accordance with the invention, this equivalence investigation is produced by reference to the gate level description. More specifically, the present invention is directed to converting a gate level description of a specification circuit and an implementation circuit; converting the gate level descriptions to networks of elementary arithmetic 1-bit operations; comparing the networks of elementary arithmetic 1-bit operations of the specification and implementation circuits; and determining whether the two circuits are equivalent. Equivalence exists where the networks of elementary arithmetic 1-bit operations of both circuits are the same.

BRIEF DESCRIPTION OF THE DRAWINGS

In order to more fully understand the manner in which the above-recited and other advantages and objects of the invention are obtained, a more particular description of the invention will be rendered by reference to specific embodiments thereof which are illustrated in the appended drawings. Understanding that these drawings depict only typical embodiments of the invention and are not therefore to be considered limiting of its scope, the invention in its presently understood best mode for making and using the same will be described and explained with additional specificity and detail through the use of the accompanying drawings in which.

DETAILED DESCRIPTION OF THE PREFERRED EMBODIMENTS

The partial products that are formed from the inputs to the second function block, in which the partial products are added up to form the final result. The partial products as inputs to this addition circuit will be referred to as primary summands in the following text.

Figure 1:
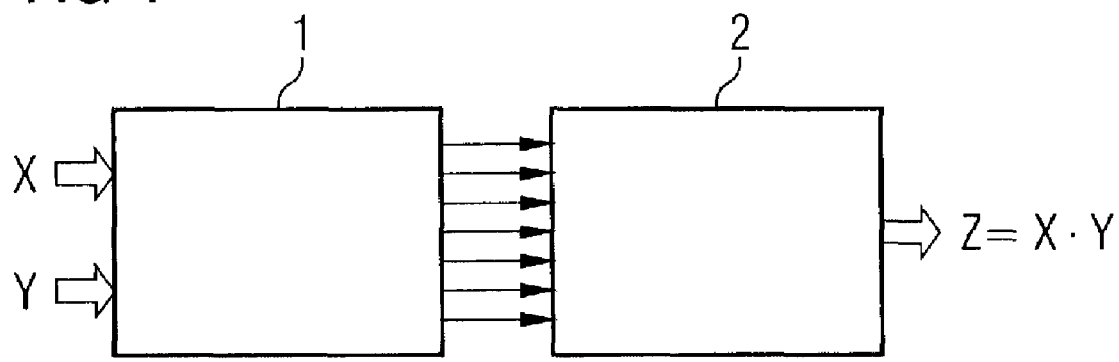
FIG. 1 is a schematic illustration of function blocks according to aspects of the invention.

FIG. 1 shows an illustration of the described function blocks. The number 1 denotes the first function block for producing the primary summands. The number 2 denotes the addition circuit.

The object of the present invention is to propose a method and an apparatus which allow an equivalence investigation of multipliers which are produced in the gate level description.

According to the invention, this object is achieved by converting the gate level description of the specification and implementation to a network of elementary arithmetic 1-bit operations (XOR, half-adders, full adders), wherein the equivalence of the specification and implementation is identified in that a comparison of the resultant networks from elementary arithmetic 1-bit operations is carried out directly.

In this case, if the result of the comparison is correspondingly negative, it is also possible to identify the fact that the specification and implementation are not equivalent.

Figure 2:
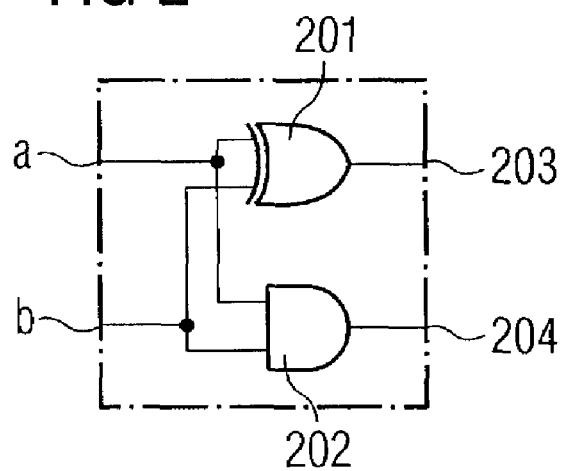
FIG. 2 is a schematic illustration showing the use of a half-adder according to aspects of the invention.

The comparison process is carried out by applying associative and communicative rules to these networks. Thus, to do this, the gate level description of the addition network must first of all be converted to a network of elementary arithmetic 1-bit operations. Such an elementary operation is carried out, for example, by a half-adder. The half-adder adds two 1-bit numbers and calculates a sum and a carry bit. The circuit symbol for the half-adder, which is composed of an XOR operation and an AND operation, is shown in FIG. 2.

The inputs a and b are referred to as operands. The XOR gate is annotated with the reference number 201 and the AND gate is annotated with the reference number 202. The output of the XOR gate, as the output from the half-adder, is annotated by the reference number 203. This output is also referred to as the "sum". The output of the AND gate, as the output of the half-adder, is annotated by the reference number 204. This output is also referred to as the "carry".

Figure 3:
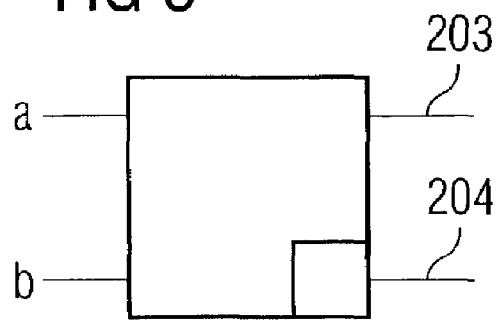
FIG. 3 is a schematic illustration of a circuit symbol for a half-adder.

The circuit symbol for the half-adder is shown in FIG. 3.

A circuit description which consists entirely of elementary arithmetic 1-bit operations is referred to in the following text as the "arithmetic bit level description" of the circuit.

The equivalence verification of the implementation and specification using the arithmetic bit level description involves little computation complexity. Since the individual nodes of a network can be interchanged at the arithmetic bit level in accordance with the communicative and associative rule, it is sufficient as an equivalence verification for each output bit in the implementation and for its corresponding output bit in the specification to check whether the set of the primary summands, which are used for the network of this output bit, is the same in the specification and implementation, the further summands of this network in the specification and implementation comprise the carries of the network which is associated with the next lower-value output bit, and the next lower-value output bits are likewise equivalent.

Figure 4:
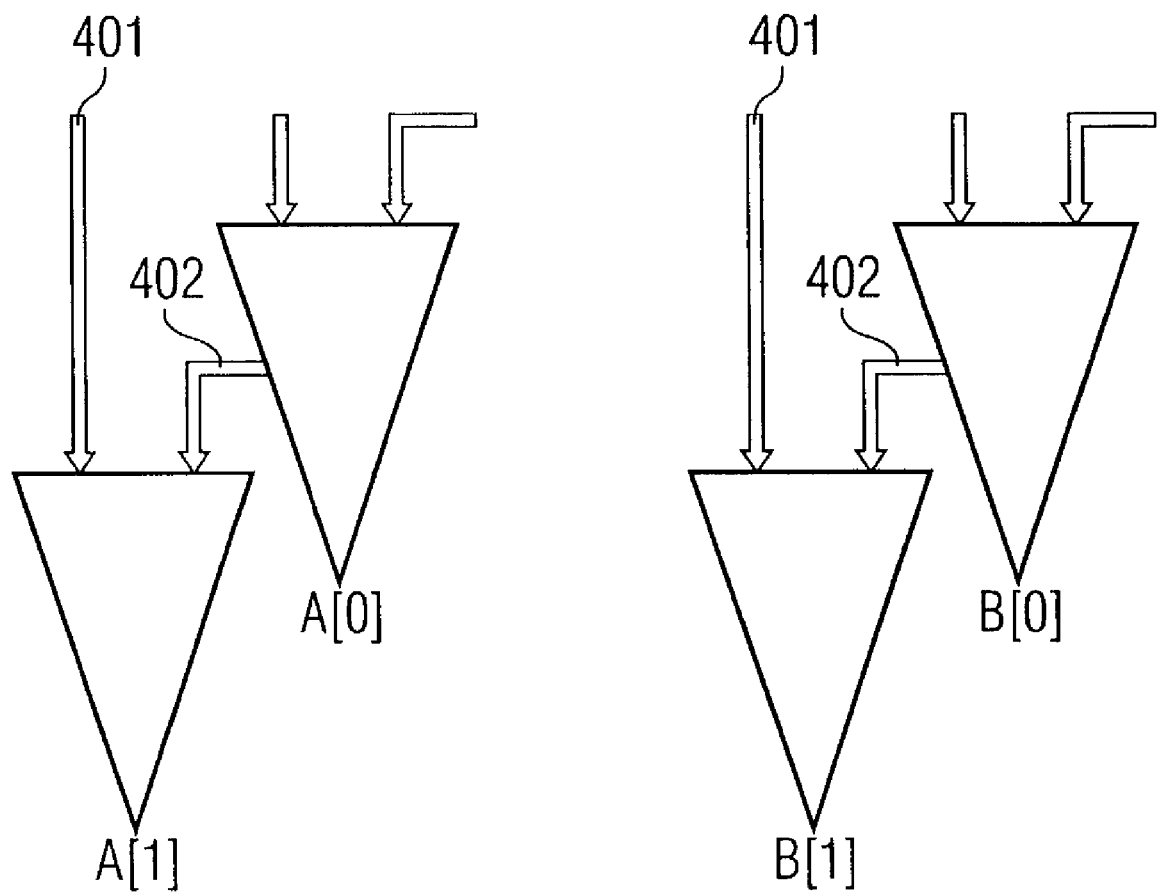
FIG. 4 is a schematic representation of the outputs of circuits according to aspects of the invention.

This principle, in which the outputs of the circuits are compared with one another, is shown in FIG. 4.

B(1) denotes the output bit from the circuit B. B(0) denotes the next lower-value output bit from the circuit B.

A(1) denotes the output bit from the circuit A. A(0) denotes the next lower-value output bit from A.

The reference number 402 denotes the carries in the circuits A and B. The reference number 401 denotes the primary summands of A(1) as well as B(1).

Alternatively, other embodiments of the equivalence verification are also feasible, which likewise make use of the fact that associative and communicative rules are applied between all adjacent nodes of the arithmetic bit level. By way of example, the equivalence verification of the implementation and specification can also be made possible by interchanging nodes in the network, such that internal equivalence points are generated which then allow a conventional structural equivalence comparison.

Figure 5:
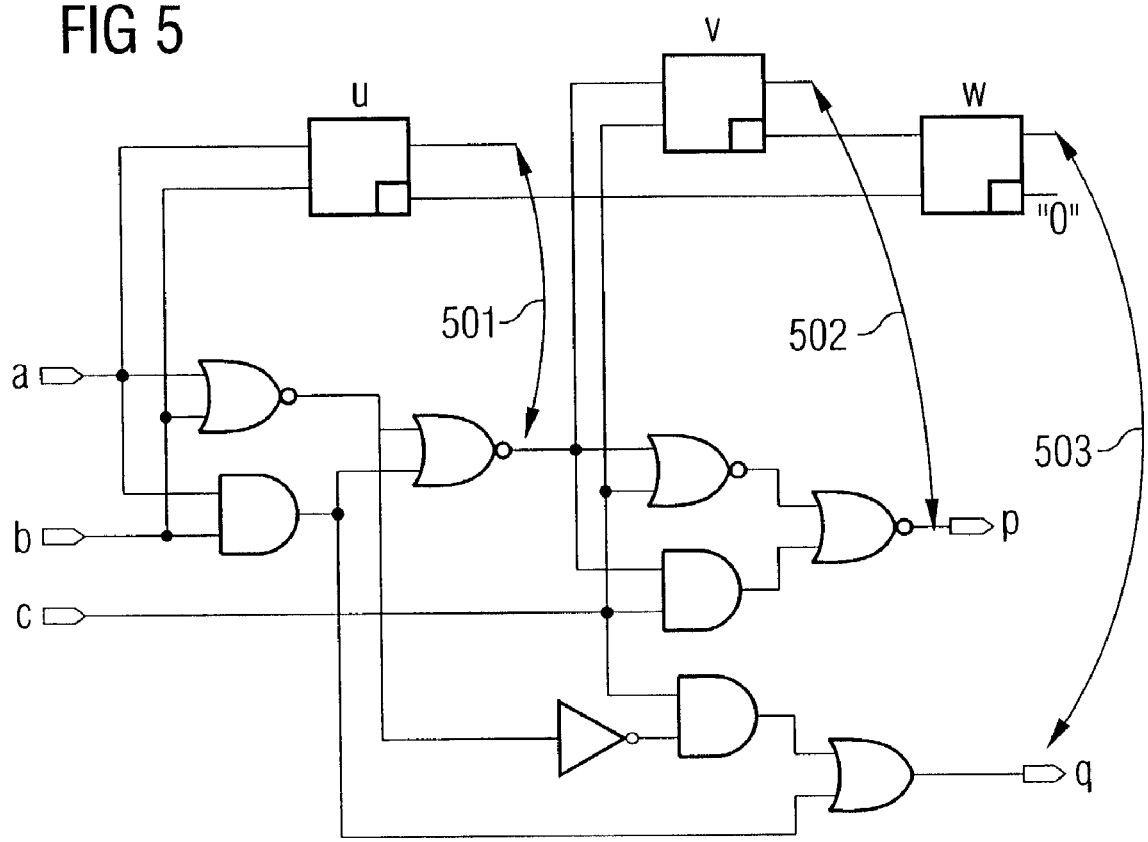
FIGS. 5 and 6 are schematic representations of then handling of gate level descriptions according to aspects of the invention.
Figure 6:
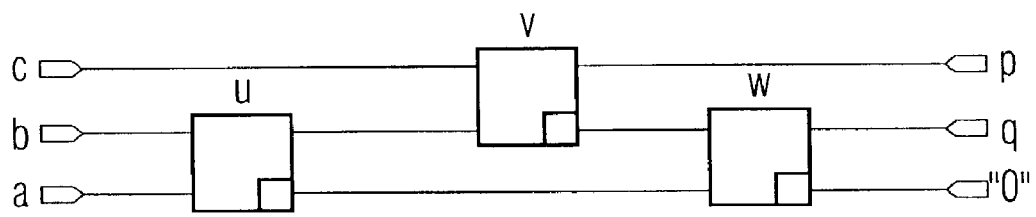

An exemplary embodiment, as it may be realized in an apparatus of the present invention, relating to the conversion of the representation at the gate level to the arithmetic bit level will be explained in the following text. This conversion can be carried out in various ways. The embodiment described in the following text is initially oriented on the XOR operations which can be identified in the circuit. A reference circuit is now constructed, in which a half-adder is used for each XOR operation in the original gate level description. Following this, XOR operations are also identified in the reference circuit, and further half-adders are added. In a similar way to that used in the methods for structural equivalence comparison, internal equivalences can now be identified between the signals in the gate level description and the reference circuit. This is shown in FIG. 5 for the gate level description of a full adder which, in the reference circuit, is composed of three half-adders u, v and w. The arrows 501, 502 and 503 in this case denote equivalence points in the circuit at gate level to the reference circuit. Coverage of the gate level description by means of half-adders is then sought. This represents the arithmetic bit level description of the associated circuit. FIG. 6 shows the arithmetic bit level representation of the full adder.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A method for verification of arithmetic digital circuits, comprising the steps of:

providing a specification circuit;

providing an implementation circuit;

converting a gate level description of the specification circuit and the implementation circuit to a network of elementary arithmetic 1-bit operations;

comparing said networks of elementary arithmetic 1-bit operations of the specification and implementation circuits; and determining whether the specification circuit and the implementation circuits are equivalent, wherein equivalence exists when the comparison of said networks of elementary arithmetic 1-bit operations of the specification and implementation circuits shows them to be the same.

2. A method according to claim 1, wherein the conversion of the gate level description to the network of elementary arithmetic 1-bit operations is carried out by first identifying XOR operations in the circuit, and then combined to form half-adders, taking into account any existing AND operations.

3. An apparatus for verification of arithmetic digital circuits, comprising:

means for converting the gate level description of the specification and implementation circuits to a network of elementary arithmetic 1-bit operations;

means for comparing the networks of elementary arithmetic 1-bit operations of the specification and implementation circuits; and means for determining equivalence of the specification and implementation circuits, wherein equivalence exists when the comparison of said networks of elementary arithmetic 1-bit operations of the specification and implementation circuits shows them to be the same.

4. An apparatus for verification of arithmetic digital circuits, comprising:

means for converting the gate level description of the specification and implementation circuits to a network of elementary arithmetic 1-bit operations;

means for comparing the networks of elementary arithmetic 1-bit operations of the specification and implementation circuits; and means for determining equivalence of the specification and implementation circuits, wherein equivalence exists when the comparison of said networks of elementary arithmetic 1-bit operations of the specification and implementation circuits shows them to be the same;

wherein the apparatus is designed such that it carries out the conversion of the gate level description to the network of elementary arithmetic 1-bit operations in such a way that it first identifies XOR operations in the circuit and then combines them to form half-adders, taking into account any existing AND operations.

* * * * *